(12) United States Patent
Park et al.

(10) Patent No.: US 10,650,970 B2
(45) Date of Patent: May 12, 2020

(54) MULTILAYER ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Heung Kil Park, Suwon-si (KR); Se Hun Park, Suwon-si (KR); Gu Won Ji, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 235 days.

(21) Appl. No.: 15/813,779

(22) Filed: Nov. 15, 2017

(65) Prior Publication Data
US 2019/0008036 A1    Jan. 3, 2019

(30) Foreign Application Priority Data
Jun. 30, 2017  (KR) .......................... 10-2017-0083343

(51) Int. Cl.
*H01G 4/232* (2006.01)
*H01G 4/30* (2006.01)
(Continued)

(52) U.S. Cl.
CPC ............... *H01G 4/232* (2013.01); *H01G 2/06* (2013.01); *H01G 4/30* (2013.01); *H05K 3/3426* (2013.01);
(Continued)

(58) Field of Classification Search
CPC ............. H01G 4/30; H01G 4/228; H01G 2/06
See application file for complete search history.

(56) References Cited

U.S. PATENT DOCUMENTS

| 6,515,844 B1 * | 2/2003 | Moriwaki | H01C 1/028 |
| | | | 361/301.4 |
| 2010/0188798 A1 | 7/2010 | Togashi et al. | |
| 2015/0187495 A1 * | 7/2015 | Maeda | H01G 4/30 |
| | | | 361/303 |

FOREIGN PATENT DOCUMENTS

| CN | 104752055 A | 7/2015 |
| JP | 2000-182888 A | 6/2000 |

(Continued)

OTHER PUBLICATIONS

Office Action issued in corresponding Chinese Patent Application No. 201810062899.8 dated Jan. 22, 2020, with English abstract.

*Primary Examiner* — Eric W Thomas
(74) *Attorney, Agent, or Firm* — Morgan, Lewis & Bockius LLP

(57) ABSTRACT

A multilayer electronic component includes: a capacitor body including a plurality of dielectric layers and a plurality of first and second internal electrodes alternately disposed with respective dielectric layers interposed between each pair of first and second internal electrodes, the capacitor body having third and fourth surfaces opposing each other, an end of each the first and second internal electrodes being exposed through the third and fourth surfaces, respectively; first and second external electrodes disposed on the third and fourth surfaces of the capacitor body, respectively; and first and second connection terminals connected to the first and second external electrodes, respectively, wherein each of the first and second connection terminals includes a vertical portion disposed to face the external electrode, a horizontal portion extended from a lower end of the vertical portion, and a cut portion formed in a portion connecting the vertical portion and the horizontal portion to each other.

18 Claims, 10 Drawing Sheets

(51) Int. Cl.
   *H01G 2/06*      (2006.01)
   *H05K 3/34*      (2006.01)
   *H01G 4/12*      (2006.01)
(52) U.S. Cl.
   CPC ..... *H01G 4/12* (2013.01); *H05K 2201/10833* (2013.01)

(56) References Cited

FOREIGN PATENT DOCUMENTS

| | | |
|---|---|---|
| JP | 2004-266110 A | 9/2004 |
| JP | 3847265 B2 | 11/2006 |
| JP | 2010-186884 A | 8/2010 |
| JP | 2011-071220 A | 4/2011 |
| JP | 2014-229869 A | 12/2014 |
| KR | 10-2010-0087622 A | 8/2010 |
| KR | 10-2015-0127965 A | 11/2015 |

\* cited by examiner

MULTILAYER ELECTRONIC COMPONENT AND BOARD HAVING THE SAME

CROSS-REFERENCE TO RELATED APPLICATION(S)

This application claims benefit of priority under 35 U.S.C. § 119 to Korean Patent Application No. 10-2017-0083343 filed on Jun. 30, 2017 in the Korean Intellectual Property Office, the disclosure of which is incorporated herein by reference in its entirety for all purposes.

TECHNICAL FIELD

The present disclosure relates to a multilayer electronic component and a board having the same.

BACKGROUND

A multilayer capacitor is formed of a dielectric material. The dielectric material may have a piezoelectric property resulting in deformation of the dielectric material synchronized with a voltage applied thereto.

When a period of the applied voltage is in an audio frequency band, a displacement of the dielectric material may become vibration which may be transferred to a circuit board through solders. Such vibrations of the circuit board are can be heard as sound, known as acoustic noise.

In a case in which a device is operated in a silent environment, a user may experience the acoustic noise as an abnormal sound and believe that a fault has occurred in the device. In addition, in a device having an audio circuit, the acoustic noise may overlap an audio output resulting in deterioration of quality of the output.

In a case in which piezoelectric vibrations of the multilayer capacitor are generated in a high frequency region of 20 kHZ or more, outside the acoustic frequencies that can be heard by humans, malfunctions of various sensors used in information technology (IT) and industry/electrical component fields may be caused.

External electrodes of the capacitor and the circuit board are connected to each other by solders. In this case, the solders are formed in an inclined state at a predetermined height on surfaces of the external electrodes on both side surfaces or both end surfaces of a capacitor body. Here, in the case that a volume and a height of the solders are increased, the vibrations of the multilayer capacitor are more easily transferred to the circuit board, such that a magnitude of the generated acoustic noise may be increased.

SUMMARY

An aspect of the present disclosure may provide a multilayer electronic component having reduced acoustic noise and high frequency vibrations in a high frequency region of 20 kHZ or more, and a board having the same.

According to an aspect of the present disclosure, a multilayer electronic component may include: a capacitor body including a plurality of dielectric layers and a plurality of first and second internal electrodes alternately disposed with respective dielectric layers interposed therebetween, the capacitor body having first and second surfaces opposing each other, third and fourth surfaces connected to the first and second surfaces and opposing each other, and fifth and sixth surfaces connected to the first, second, third and fourth surfaces, and opposing each other, one end of the first internal electrode being exposed through the third surface, and one end of the second internal electrode being exposed through the fourth surface, respectively; first and second external electrodes disposed on the third and fourth surfaces of the capacitor body, respectively; and first and second connection terminals connected to the first and second external electrodes, respectively, wherein the first connection terminal includes a first vertical portion disposed to face the first external electrode, a first horizontal portion extended from a lower end of the first vertical portion in a direction toward the fourth surface of the capacitor body, and a first cut portion formed in a portion connecting the first vertical portion and the first horizontal portion to each other, and the second connection terminal includes a second vertical portion disposed to face the second external electrode, a second horizontal portion extended from a lower end of the second vertical portion in a direction toward the third surface of the capacitor body, and a second cut portion formed in a portion connecting the second vertical portion and the second horizontal portion to each other.

The first cut portion may include a first stress suppressing portion formed in the lower end of the first vertical portion and a first solder pocket communicating with the first stress suppressing portion and formed in one end of the first horizontal portion, and the second cut portion may include a second stress suppressing portion formed in the lower end of the second vertical portion and a second solder pocket communicating with the second stress suppressing portion and formed in one end of the second horizontal portion.

The first cut portion may be positioned in a center of the first connection terminal in a direction in which the fifth and sixth surfaces of the capacitor body are connected to each other, and the second cut portion may be positioned in a center of the second connection terminal in the direction in which the fifth and sixth surfaces of the capacitor body are connected to each other.

The first cut portion may be formed in at least one edge of the first connection terminal in a direction in which the fifth and sixth surfaces of the capacitor body are connected to each other, and the second cut portion may be formed in at least one edge of the second connection terminal in the direction in which the fifth and sixth surfaces of the capacitor body are connected to each other.

The first and second vertical portions may cover an entirety of the first and second external electrodes, respectively.

The multilayer electronic component may further include conductive adhesive layers disposed between the first and second external electrodes and the first and second vertical portions, respectively.

The first and second external electrodes may include, respectively, first and second body portions respectively disposed on the third and fourth surfaces of the capacitor body and first and second band portions respectively extended from the first and second body portions to portions of the first surface of the capacitor body, the first and second vertical portions and the first and second body portions may be disposed to be spaced apart from each other, respectively, the first connection terminal may further include a third horizontal portion extended from an upper end of the first vertical portion to be connected to the first band portion, and the second connection terminal may further include a fourth horizontal portion extended from an upper end of the second vertical portion to be connected to the second band portion.

The first connection terminal may further include a third cut portion formed in a portion connecting the first vertical portion and the third horizontal portion to each other, and the second connection terminal may further include a fourth cut portion formed in a portion connecting the second vertical portion and the fourth horizontal portion to each other.

The third cut portion may include a third stress suppressing portion formed in the upper end of the first vertical portion and a third solder pocket communicating with the third stress suppressing portion and formed in one end of the third horizontal portion, and the fourth cut portion may include a fourth stress suppressing portion formed in the upper end of the second vertical portion and a fourth solder pocket communicating with the fourth stress suppressing portion and formed in one end of the fourth horizontal portion.

The third cut portion may be positioned in a center of the first connection terminal in a direction in which the fifth and sixth surfaces of the capacitor body are connected to each other, and the fourth cut portion may be positioned in a center of the second connection terminal in the direction in which the fifth and sixth surfaces of the capacitor body are connected to each other.

The third cut portion may be formed in at least one edge of the first connection terminal in a direction in which the fifth and sixth surfaces of the capacitor body are connected to each other, and the fourth cut portion may be formed in at least one edge of the second connection terminal in the direction in which the fifth and sixth surfaces of the capacitor body are connected to each other.

The multilayer electronic component may further include conductive adhesive layers disposed between the third and fourth horizontal portions and the first and second band portions, respectively.

The multilayer electronic component may further include a capsule portion covering at least portions of upper portions of the capacitor body, the first and second external electrodes, and the first and second connection terminals in a state in which the first and second cut portions are exposed and including an insulator.

The capsule portion may cover an entirety of the capacitor body and the first and second external electrodes.

According to another aspect of the present disclosure, a board having a multilayer electronic component may include: a circuit board having first and second electrode pads disposed on one surface thereof; and the multilayer electronic component as described above mounted on the circuit board so that the first and second horizontal portions of the first and second connection terminals are connected to the first and second electrode pads, respectively.

According to an aspect of the present disclosure, a multilayer electronic component may include a capacitor body having six surfaces and a substantially rectangular cross-section, the capacitor body having a first external electrode disposed on a first surface and a second external electrode disposed on a second surface opposite the first surface; a first connection terminal; and a second connection terminal, each of the first connection terminal and the second connection having a vertical portion and a horizontal portion, the horizontal portions configured to connect to a circuit board. The first connection terminal and the second connection terminal each have a cut portion formed at an intersection of the corresponding vertical and horizontal portions, the cut portion extending into the corresponding vertical and horizontal portions.

The vertical portions of the first connection terminal and the second connection terminal may be connected to the corresponding external electrodes.

The first external electrode and the second external electrode may further be disposed on a third surface substantially perpendicular to and connecting the first surface and the second surface. The first connection terminal and the second connection terminal each further have a second horizontal portion, the second horizontal portion being substantially parallel to the corresponding first horizontal portion, and separated from the corresponding horizontal portion by the corresponding vertical portion. The first external terminal and the second external terminal are connected to the second horizontal portions of the corresponding external electrodes such that the second horizontal portions are disposed above the corresponding external electrodes. The first connection terminal and the second connection terminal may each further have a second cut portion formed at an intersection of the corresponding vertical and second horizontal portions, the cut portion extending into the corresponding vertical and second horizontal portions.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings. In the accompanying drawings, shapes, sizes, and the like, of components may be exaggerated or shortened for clarity.

In the present disclosure, terms "lower side", "lower portion", "lower surface", and the like, have been used to indicate a direction toward a mounted surface of the semiconductor device in relation to cross sections of the drawings, terms "upper side", "upper portion", "upper surface", and the like, have been used to indicate an opposite direction to the direction indicated by the terms "lower side", "lower portion", "lower surface", and the like. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Figure 1:
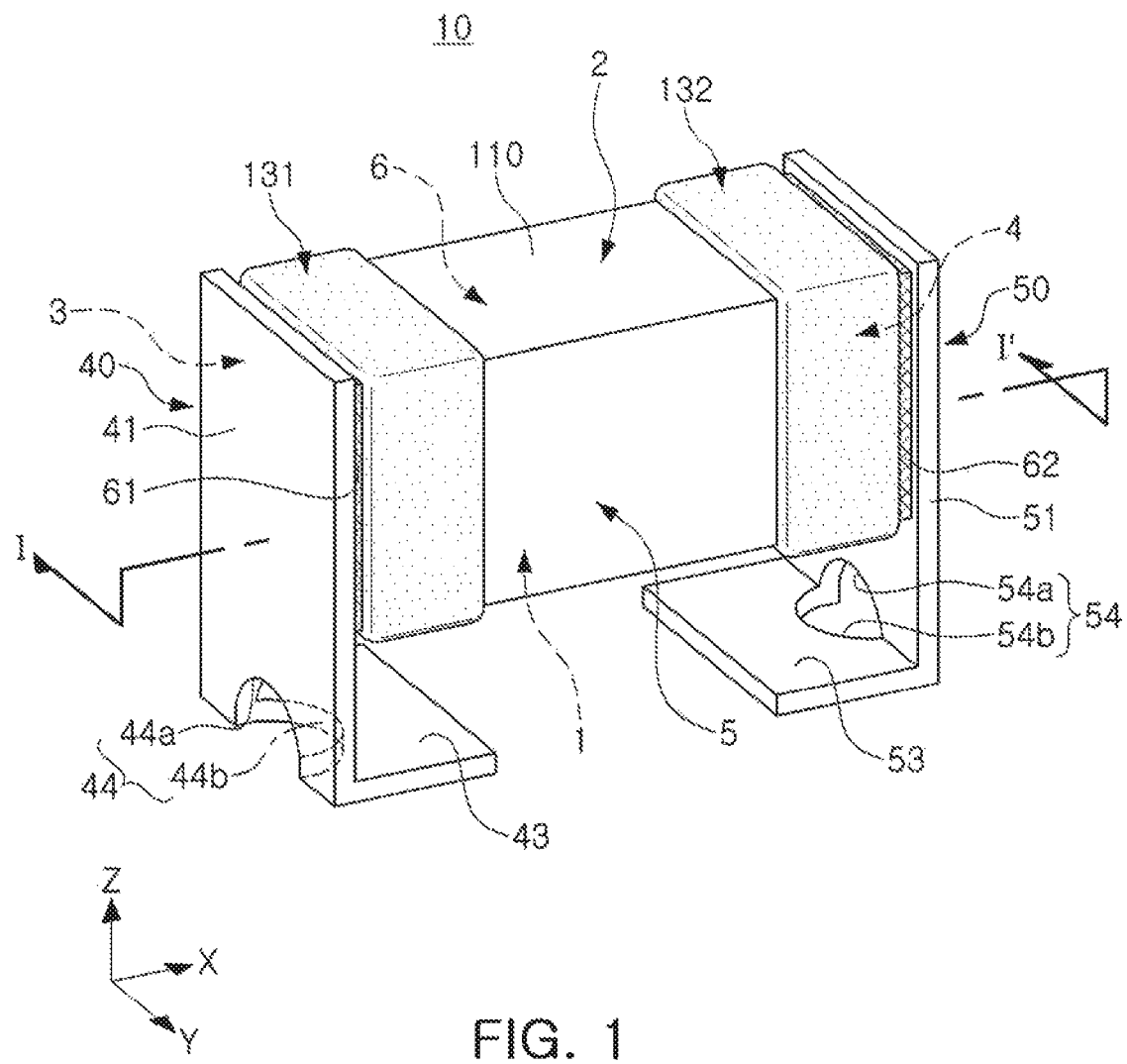
FIG. 1 is a perspective view illustrating a multilayer electronic component according to an embodiment in the present disclosure.
Figure 2:
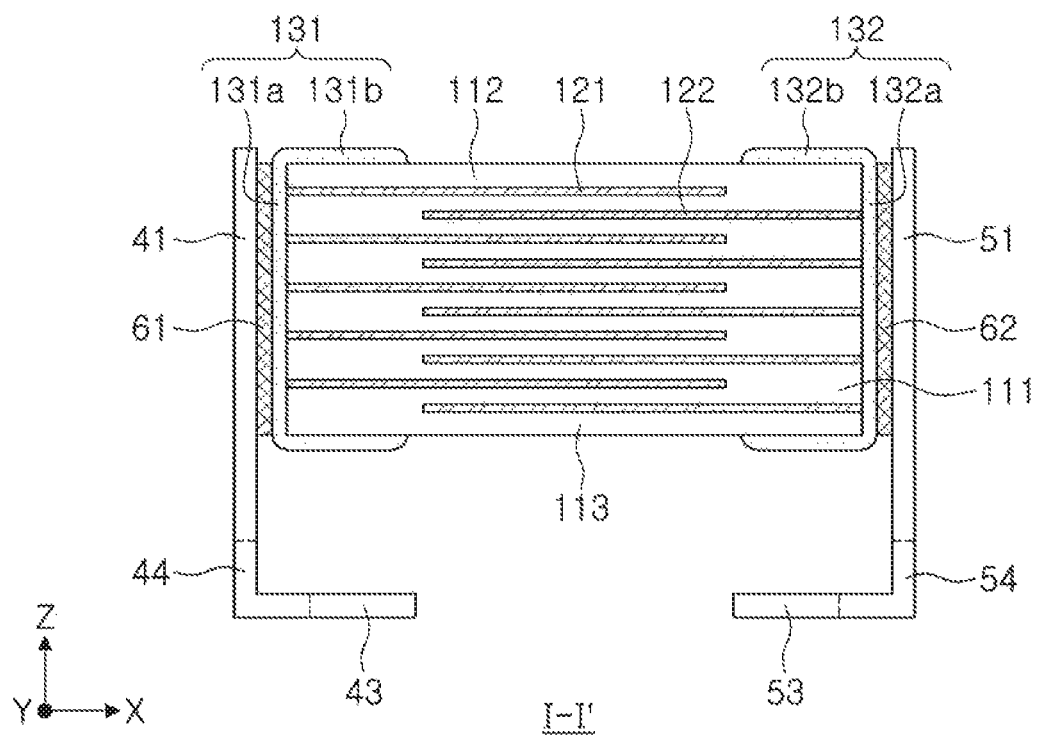
FIG. 2 is a cross-sectional view taken along line I-I' of FIG. 1.
Figure 3A:
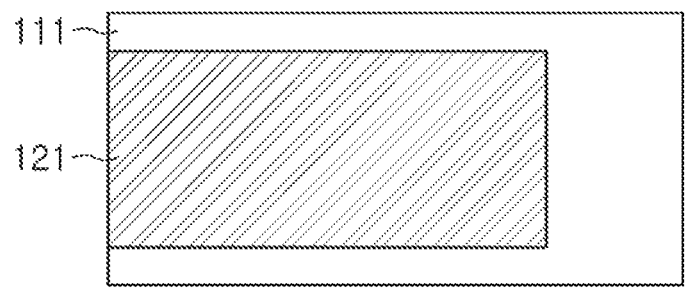
FIGS. 3A and 3B are plan views illustrating, respectively, first and second internal electrodes of the multilayer electronic component according to an embodiment in the present disclosure.
Figure 3B:
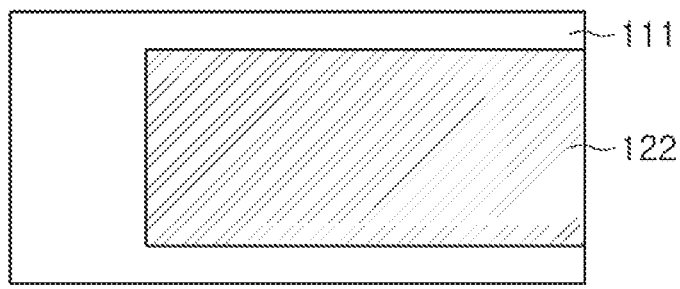

FIG. 1 is a perspective view illustrating a multilayer electronic component according to an embodiment in the present disclosure, FIG. 2 is a cross-sectional view taken along line I-I' of FIG. 1, and FIGS. 3A and 3B are plan views illustrating, respectively, first and second internal electrodes of the multilayer electronic component according to an embodiment in the present disclosure.

Referring to FIGS. 1 through 3, a multilayer electronic component 10 according to an embodiment in the present disclosure includes a capacitor body 110, first and second external electrodes 131 and 132, and first and second connection terminals 40 and 50 connected to the first and second external electrodes 131 and 132, respectively.

Hereinafter, directions of the capacitor body 110 will be defined in order to clearly describe embodiments in the present disclosure. X, Y and Z in the drawings refer to a length direction, a width direction, and a thickness direction of the capacitor body 110, respectively. In addition, in the present embodiment, the thickness direction refers to a direction in which dielectric layers are stacked.

The capacitor body 110 is formed by stacking and then sintering a plurality of dielectric layers 111 in the Z direction, and includes the plurality of dielectric layers 111 and a plurality of first and second internal electrodes 121 and 122 alternately disposed in the Z direction with each of the dielectric layers 111 interposed therebetween.

In addition, covers 112 and 113 having a predetermined thickness may be formed, respectively, at both sides of the capacitor body 110 in the Z direction, if necessary.

Here, the respective adjacent dielectric layers 111 of the capacitor body 110 may be integrated with each other so that boundaries therebetween are not readily apparent.

The capacitor body 110 may have a substantially hexahedral shape. However, a shape of the capacitor body 110 is not limited thereto.

In the present embodiment, for convenience of explanation, first and second surfaces 1 and 2 of the capacitor body 110 refer to both surfaces of the capacitor body 110 opposing each other in the Z direction, third and fourth surfaces 3 and 4 of the capacitor body 110 refer to both surfaces of the capacitor body 110 connected to the first and second surfaces 1 and 2 and opposing each other in the X direction, and fifth and sixth surfaces 5 and 6 of the capacitor body 110 refer to both surfaces of the capacitor body 110 connected to the first and second surfaces 1 and 2, connected to the third and fourth surfaces 3 and 4, and opposing each other in the Y direction. In the present embodiment, the first surface 1 may be a mounting surface.

The dielectric layer 111 may include a ceramic material having a high dielectric constant, for example, a barium titanate ($BaTiO_3$) based ceramic powder, or the like. However, a material of the dielectric layer 111 is not limited thereto.

An example of the barium titanate ($BaTiO_3$) based ceramic powder may include $(Ba_{1-x}Ca_{1-x})TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca, Zr, or the like, is partially dissolved in $BaTiO_3$. However, an example of the barium titanate ($BaTiO_3$) based ceramic powder is not limited thereto.

The dielectric layer 111 may further include a ceramic additive, an organic solvent, a plasticizer, a binder, a dispersant, and the like, in addition to the ceramic powder. As the ceramic additive, for example, a transition metal oxide or a transition metal carbide, a rare earth element, magnesium (Mg), aluminum (Al), or the like, may be used.

The first and second internal electrodes 121 and 122, which are electrodes having different polarities, may be alternately disposed to face each other in the Z direction with one of the dielectric layers 111 interposed between each pair of the first and second internal electrodes 121 and 122, and one ends of the first and second internal electrodes 121 and 122 may be exposed through the third and fourth surfaces 3 and 4 of the capacitor body 110, respectively.

Here, the first and second internal electrodes 121 and 122 are electrically insulated from each other by the dielectric layer 111 disposed therebetween.

The end portions of the first and second internal electrodes 121 and 122 alternately exposed through the third and fourth surfaces 3 and 4 of the capacitor body 110, respectively, are electrically connected to the first and second external electrodes 131 and 132 disposed on third and fourth surfaces 3 and 4 of the capacitor body 110, respectively, as described below.

The first and second internal electrodes 121 and 122 may be formed of a conductive metal such as, for example, nickel (Ni), a nickel (Ni) alloy, or the like. However, materials of the first and second internal electrodes 121 and 122 are not limited thereto.

According to the configuration as described above, when predetermined voltages are applied to the first and second external electrodes 131 and 132, electric charges may be accumulated at the first and second internal electrodes 121 and 122 facing each other.

A capacitance of the multilayer ceramic component 100 may be in proportion to an area over which the first and second internal electrodes 121 and 122 overlap each other in the Z direction.

The first and second external electrodes 131 and 132 are electrically connected to the exposed portions of the first and second internal electrodes 121 and 122, respectively. Voltages having different polarities may be provided to the first and second external electrodes 131 and 132, respectively.

Plating layers may be formed on surfaces of the first and second external electrodes 131 and 132, if necessary.

For example, the first and second external electrodes 131 and 132 may include first and second conductive layers, first and second nickel (Ni) plating layers formed on the first and second conductive layers, and first and second tin (Sn) plating layers formed on the first and second nickel plating layers, respectively.

The first external electrode 131 includes a first body portion 131a and a first band portion 131b.

The first body portion 131a is formed on the third surface 3 of the capacitor body 110 and connected to the first internal electrodes 121. The first band portion 131b is extended from the first body portion 131a to a portion of the first surface 1 of the capacitor body 110, which is the mounting surface of the capacitor body 110.

The first band portion 131b may be further extended to a portion of the second surface 2 of the capacitor body 110 and portions of the fifth and sixth surfaces 5 and 6 of the capacitor body 110, if necessary, in order to improve adhesion strength, provide structural support, or the like.

The second external electrode 132 includes a second body portion 132a and a second band portion 132b.

The second body portion 132a is formed on the fourth surface 4 of the capacitor body 110 and connected to the second internal electrodes 122. The second band portion 132b is extended from the second body portion 132a to a portion of the first surface 1 of the capacitor body 110, which is the mounting surface of the capacitor body 110.

The second band portion 132b may be further extended to a portion of the second surface 2 of the capacitor body 110 and portions of the fifth and sixth surfaces 5 and 6 of the capacitor body 110, if necessary, in order to improve adhesion strength, provide structural support, or the like.

The first connection terminal 40 is formed of a conductor, and includes a first vertical portion 41 and a first horizontal portion 43.

The first vertical portion 41 is disposed to face the first body portion 131a of the first external electrode 131. The first horizontal portion 43 extends from a lower end of the first vertical portion 41 in the X direction toward the fourth surface 4 of the capacitor body 110. The first vertical portion 41 may cover the entirety of the first body portion 131a of the first external electrode 131.

In addition, a first cut portion 44 is formed in a portion connecting the first vertical portion 41 and the first horizontal portion 43 to each other.

The first cut portion 44 includes a first stress suppressing portion 44a formed in the lower end of the first vertical portion 41 and a first solder pocket 44b communicating with the first stress suppressing portion 44a and formed in one end of the first horizontal portion 43.

The second connection terminal 50 is formed of a conductor, and includes a second vertical portion 51 and a second horizontal portion 53.

The second vertical portion 51 is disposed to face the second body portion 132a of the second external electrode 132. The second horizontal portion 53 extends from a lower end of the second vertical portion 51 in the X direction toward the third surface 3 of the capacitor body 110. The second vertical portion 51 may cover the entirety of the second body portion 132a of the second external electrode 132.

A second cut portion 54 is formed in a portion connecting the second vertical portion 51 and the second horizontal portion 53 to each other.

The second cut portion 54 includes a second stress suppressing portion 54a formed in the lower end of the second vertical portion 51 and a second solder pocket 54b communicating with the second stress suppressing portion 54a and formed in one end of the second horizontal portion 53.

The first and second stress suppressing portions 44a and 54a serve to disperse and suppress stress due to piezoelectric vibrations transferred from the capacitor body 110 to reduce transferred vibrations, resulting in a reduction in acoustic noise.

The first and second stress suppressing portions 44a and 54a may disperse external impact or stress transferred from a circuit board to the capacitor body 110 at the time of mounting the multilayer electronic component 10 on the circuit board to reduce impact applied to the multilayer electronic component 10, resulting in improvement of reliability of a product.

The first and second solder pockets 44b and 54b may limit heights of solder fillets at the time of mounting the multilayer electronic component 100 on the circuit board and forming solders to efficiently block a path through which the piezoelectric vibrations of the capacitor body 110 are transferred, resulting in a reduction in the acoustic noise.

The first cut portion 44 may be positioned in the center of the first connection terminal 40 in the Y direction, which is a direction orthogonal to the fifth and sixth surfaces 5 and 6 of the capacitor body 110, and the second cut portion 54 may be positioned in the center of the second connection terminal 50 in the Y direction.

Conductive adhesive layers 61 and 62 are disposed between the first and second body portions 131a and 132a and the first and second vertical portions 41 and 51, respectively.

Figure 4:
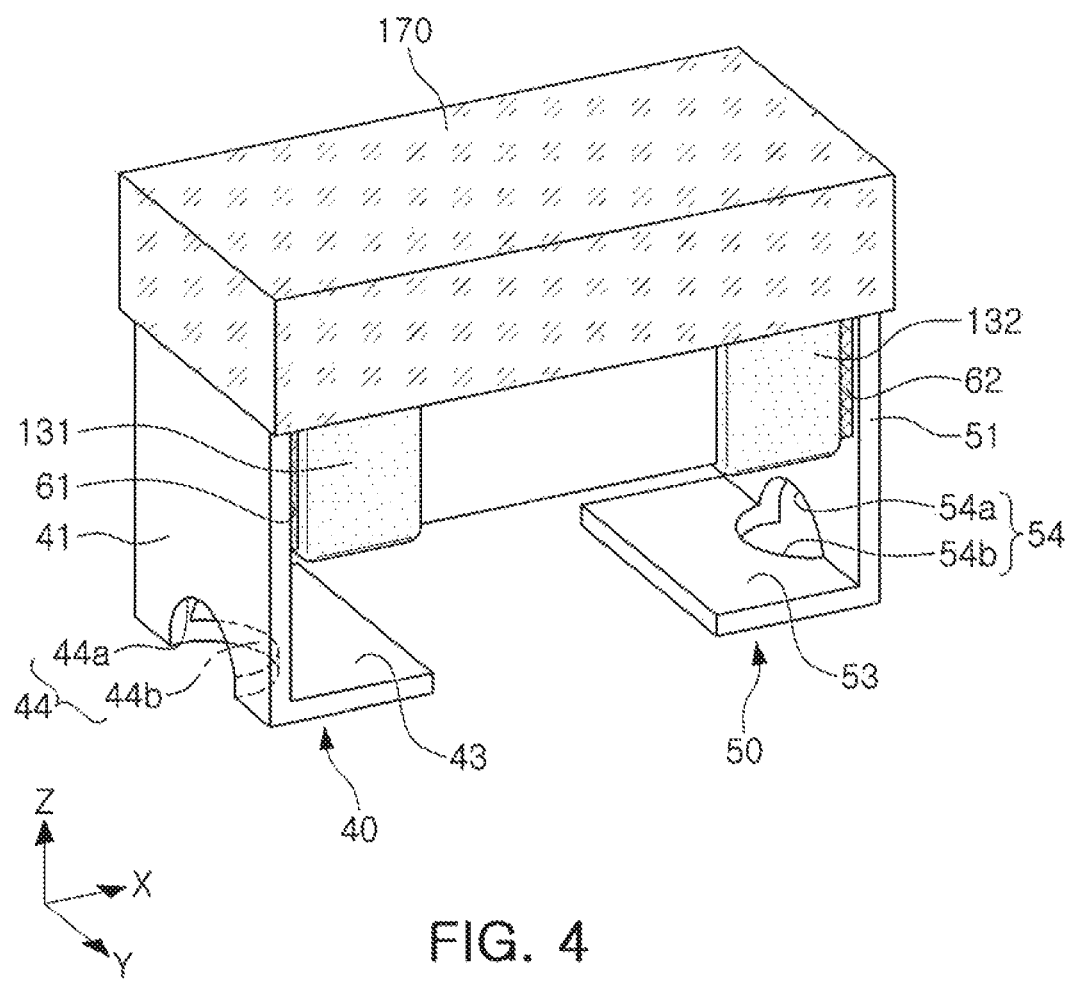
FIG. 4 is a perspective view illustrating a capsule portion formed on a multilayer electronic component illustrated in FIG. 1.
Figure 5:
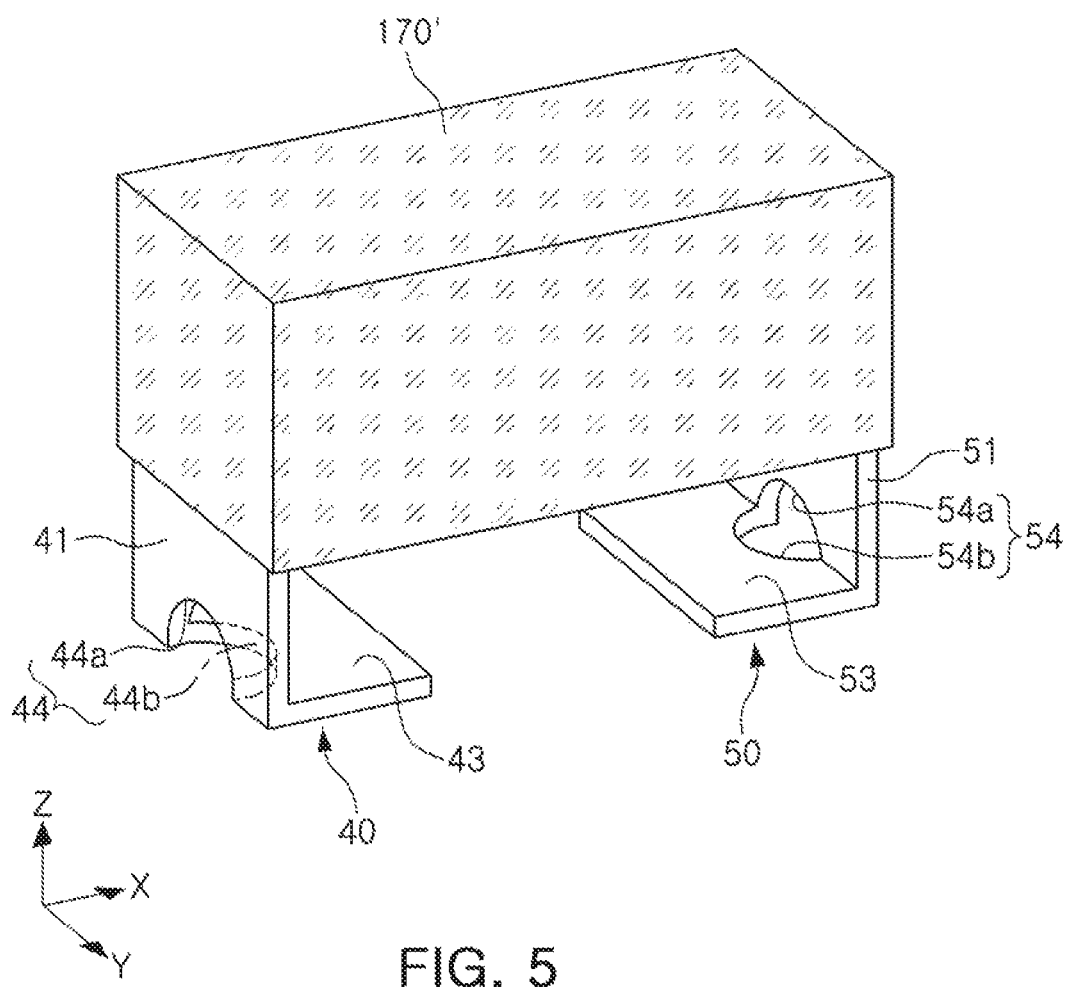
FIG. 5 is a perspective view illustrating another example of the capsule portion of FIG. 4.

FIG. 4 is a perspective view illustrating a capsule portion formed on the multilayer electronic component of FIG. 1, and FIG. 5 is a perspective view illustrating another example of the capsule portion of FIG. 4.

Referring to FIG. 4, the multilayer electronic component according to an embodiment further includes a capsule portion 170.

The capsule portion 170 may include an insulator, and covers at least portions of upper portions of the capacitor body 110, the first and second external electrodes 131 and 132, and the first and second connection terminals 40 and 50 in a state in which the first and second cut portions 44 and 54 are exposed.

Here, as illustrated in FIG. 5, a capsule portion 170' may also cover the entirety of the capacitor body 110 and the first and second external electrodes 131 and 132.

Figure 6:
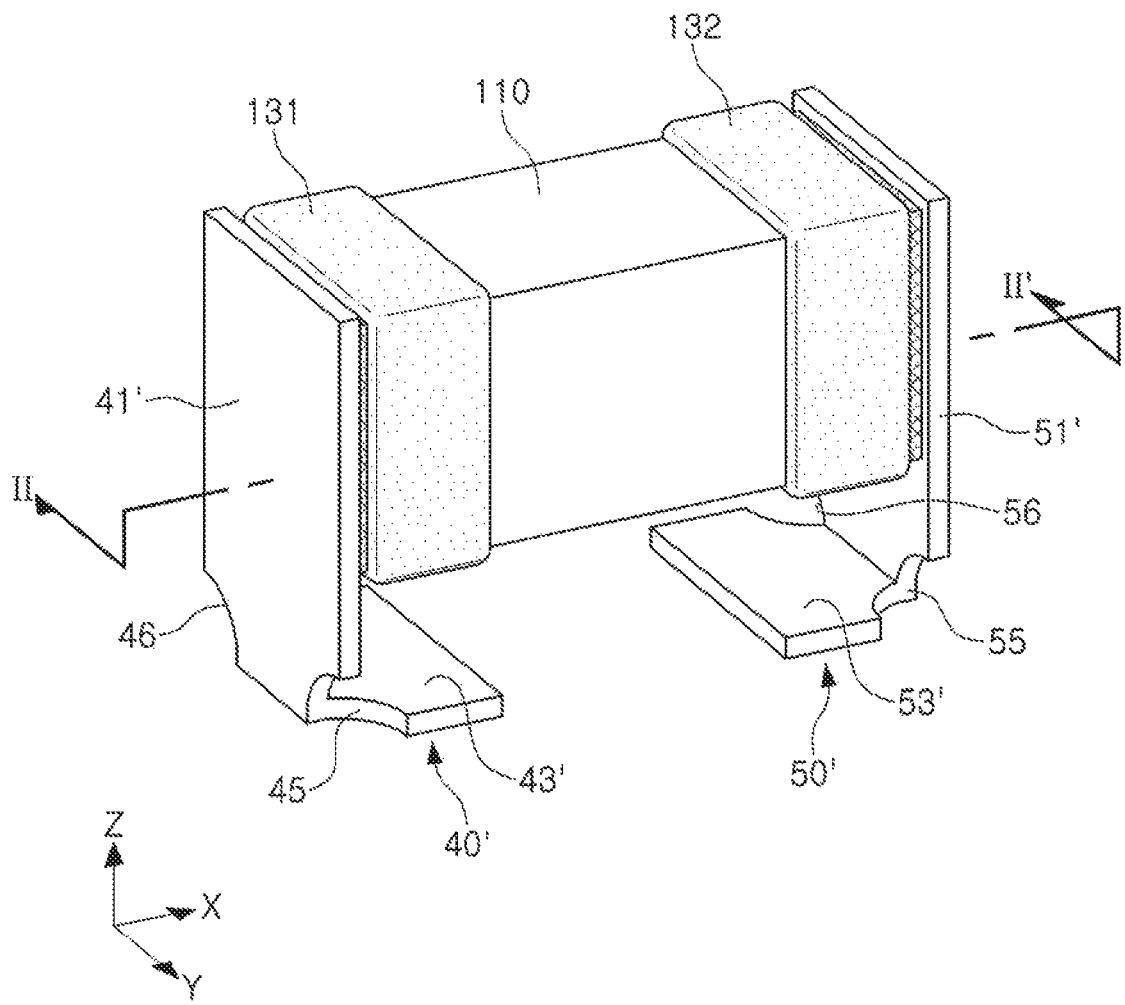
FIG. 6 is a perspective view illustrating a multilayer electronic component according to another embodiment in the present disclosure.
Figure 7:
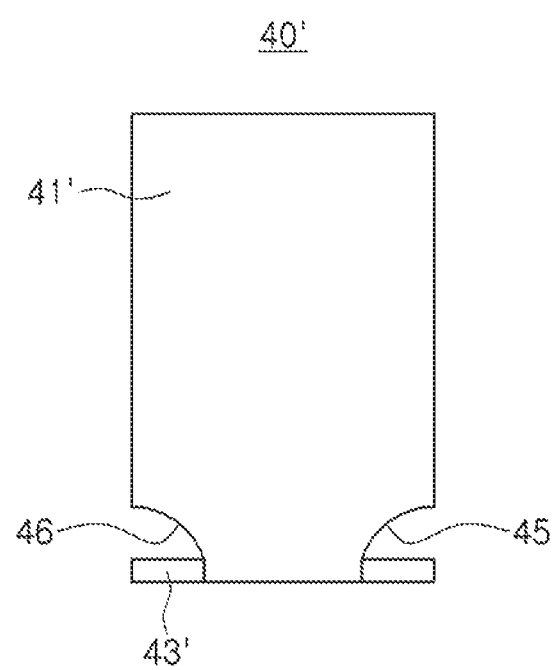
FIG. 7 is a side view illustrating a first connection terminal of FIG. 6.

FIG. 6 is a perspective view illustrating a multilayer electronic component according to a second embodiment in the present disclosure, and FIG. 7 is a side view illustrating a first connection terminal of FIG. 6.

Referring to FIGS. 6 and 7, first cut portions 45 and 46 of a first connection terminal 40' may be formed in edges of the first connection terminal 40' in the Y direction, and second cut portions 55 and 56 of a second connection terminal 50' may be formed in edges of the second connection terminal 50' in the Y direction.

Each of the first cut portions 45 and 46 includes a first stress suppressing portion formed in a lower end of a first vertical portion 41' and a first solder pocket formed in one end of a first horizontal portion 43'.

In addition, each of the second cut portions 55 and 56 includes a second stress suppressing portion formed in a lower end of a second vertical portion 51' and a second solder pocket formed in one end of a second horizontal portion 53'.

Here, a case in which the first and second cut portions are formed in both edges of the first and second connection terminals in the Y direction, respectively, is illustrated in FIGS. 6 and 7. However, the first and second cut portions are limited thereto, but may be formed in only one of the edges of the first and second connection terminals, respectively, if necessary.

Figure 8:
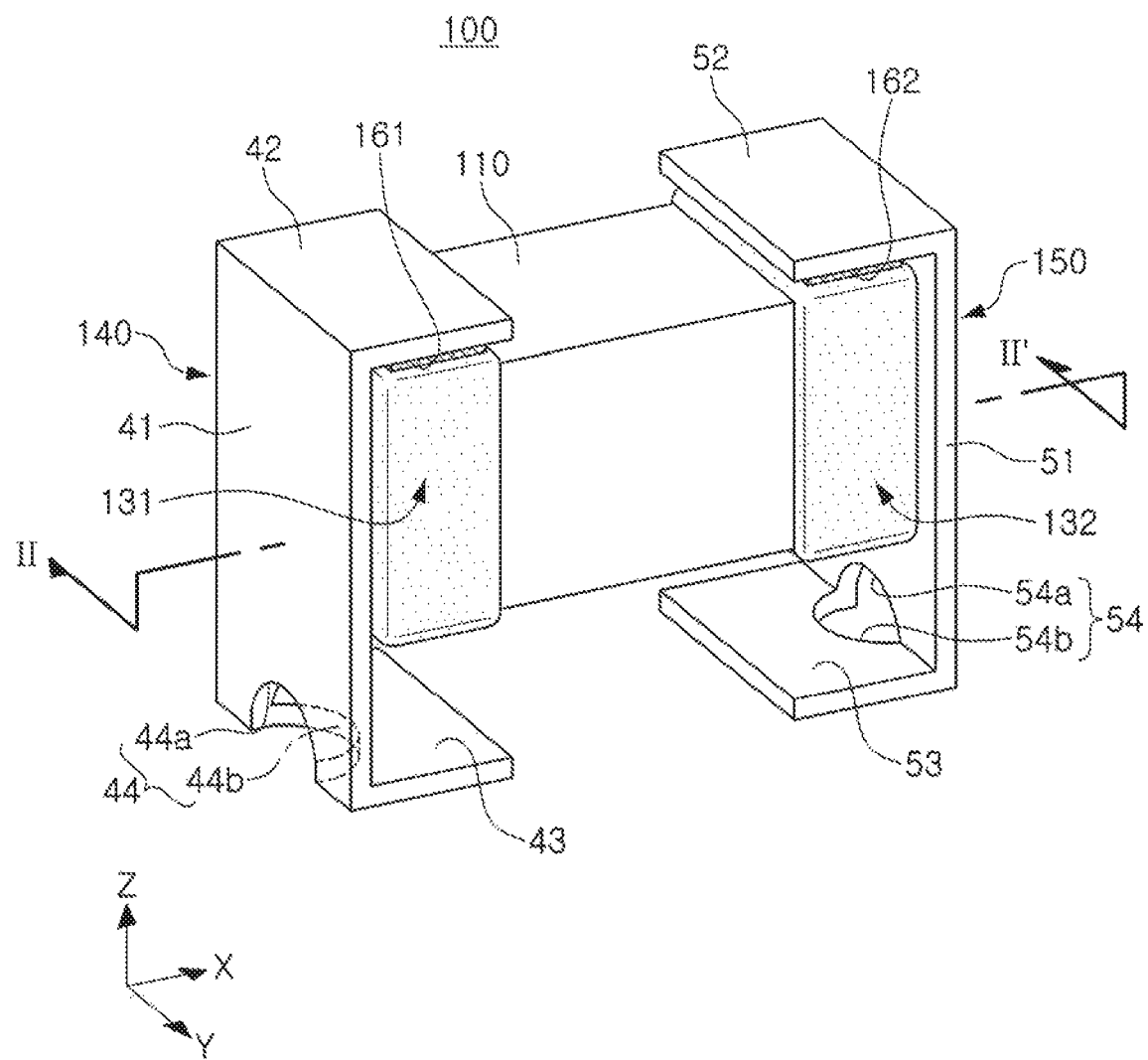
FIG. 8 is a perspective view illustrating a multilayer electronic component according to yet another embodiment in the present disclosure.
Figure 9:
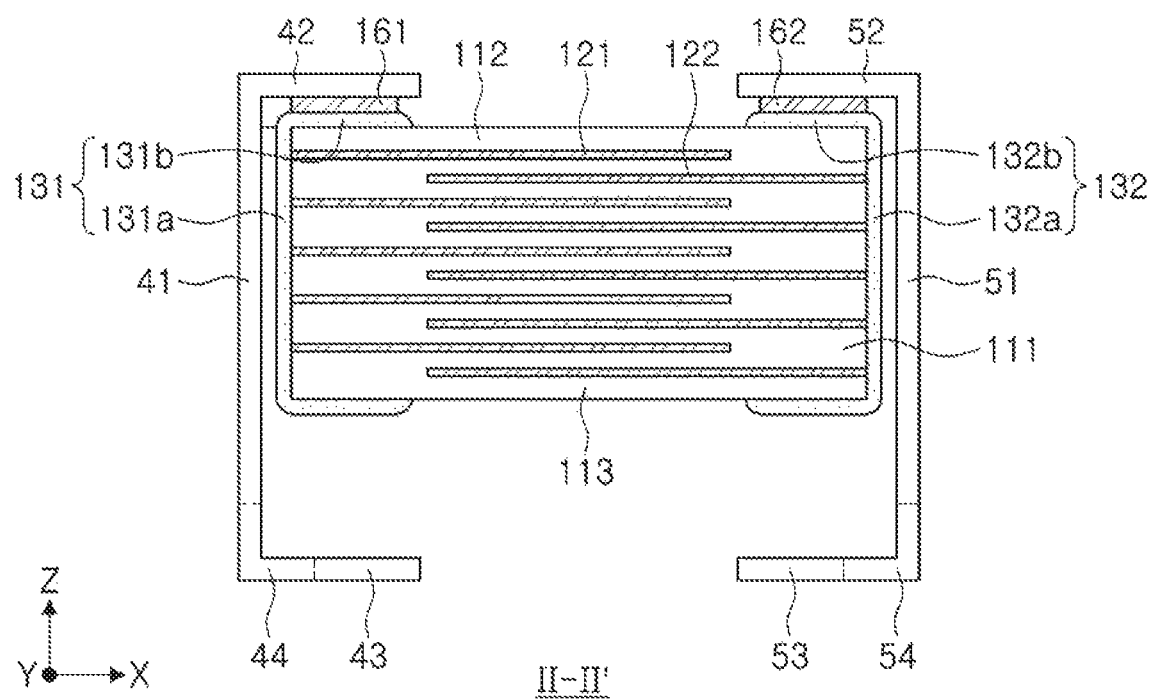
FIG. 9 is a cross-sectional view taken along line II-II' of FIG. 8.

FIG. 8 is a perspective view illustrating a multilayer electronic component according to a third embodiment in the present disclosure, and FIG. 9 is a cross-sectional view taken along line II-II' of FIG. 8.

Structures of a capacitor body 110, first and second internal electrodes 121 and 122, and first and second external electrodes 131 and 132 in a multilayer electronic component 100 according to a third embodiment in the present disclosure are similar to those of the exemplary embodiment described above, and a detailed description therefor will thus be omitted in order to avoid an overlapping description, and first and second connection terminals 140 and 150 having structures different from those of the exemplary embodiment described above will be illustrated and described in detail.

Referring to FIGS. 8 and 9, the first connection terminal 140 further includes a third horizontal portion 42 extended from an upper end of the first vertical portion 41 to be connected to the first band portion 131b formed on the second surface 2 of the capacitor body 110. The second connection terminal 150 further includes a fourth horizontal portion 52 extended from an upper end of the second vertical portion 51 to be connected to the second band portion 132b formed on the second surface 2 of the capacitor body 110.

Here, the first and second vertical portions 41 and 51 are disposed to be spaced apart from the first and second body portions 131a and 132a of the first and second external electrodes 131 and 132, respectively.

In addition, conductive adhesive layers 161 and 162 are disposed between the third and fourth horizontal portions 42 and 52 and the first and second band portions 131b and 132b, respectively.

Figure 10:
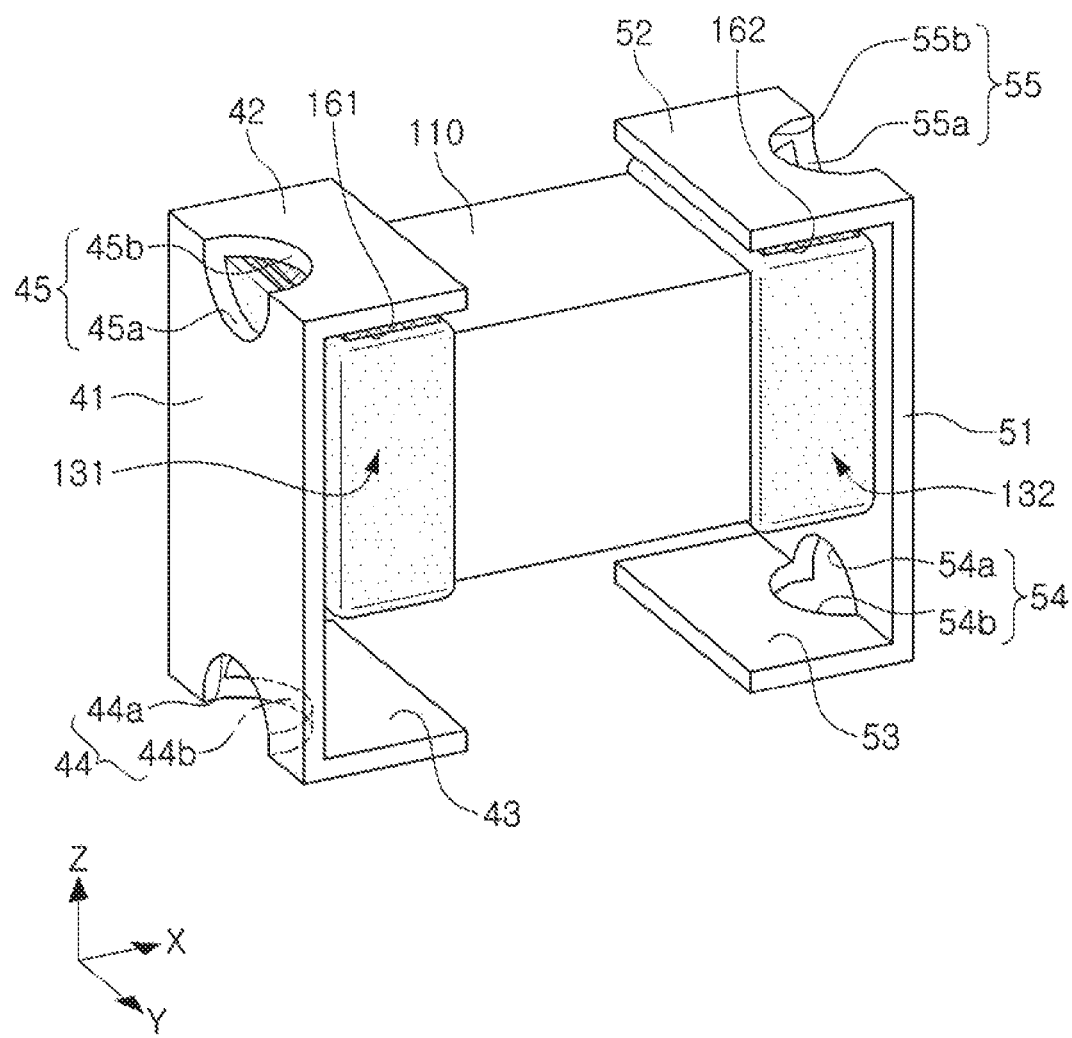
FIG. 10 is a perspective view illustrating that third and fourth cut portions are formed in FIG. 8.

Referring to FIG. 10, the first connection terminal further includes a third cut portion 45 formed in a portion connecting the first vertical portion 41 and the third horizontal portion 42 to each other. The second connection terminal further includes a fourth cut portion 55 formed in a portion connecting the second vertical portion 51 and the fourth horizontal portion 52 to each other.

The third cut portion 45 includes a third stress suppressing portion 45a formed in the upper end of the first vertical portion 41 and a third solder pocket 45b communicating with the third stress suppressing portion 45a and formed in one end of the third horizontal portion 42.

The fourth cut portion 55 includes a fourth stress suppressing portion 55a formed in the upper end of the second vertical portion 51 and a fourth solder pocket 55b communicating with the fourth stress suppressing portion 55a and formed in one end of the fourth horizontal portion 52.

Here, the third cut portion 45 may be positioned in the center of the first connection terminal 40 in the Y direction, and the fourth cut portion 55 may be positioned in the center of the second connection terminal 50 in the Y direction.

Moreover, the third cut portion may be formed in at least one edge of the first connection terminal in the Y direction, and the fourth cut portion may be formed in at least one edge of the second connection terminal in the Y direction.

When voltages having different polarities are applied to the first and second external electrodes 131 and 132 formed on the multilayer electronic component 100 in a state in which the multilayer electronic component 100 is mounted on a circuit board 210, the capacitor body 110 may expand and contract in the thickness direction due to an inverse piezoelectric effect of the dielectric layers 111, and both end portions of the first and second external electrodes 131 and 132 may contract and expand as opposed to the expansion and the contraction of the capacitor body 110 in the thickness direction due to a Poisson effect.

Such contraction and expansion may generate vibrations. These vibrations may be transferred from the first and second external electrodes 131 and 132 to the circuit board 210, and sound may thus radiate from the circuit board 210, resulting in acoustic noise.

Figure 11:
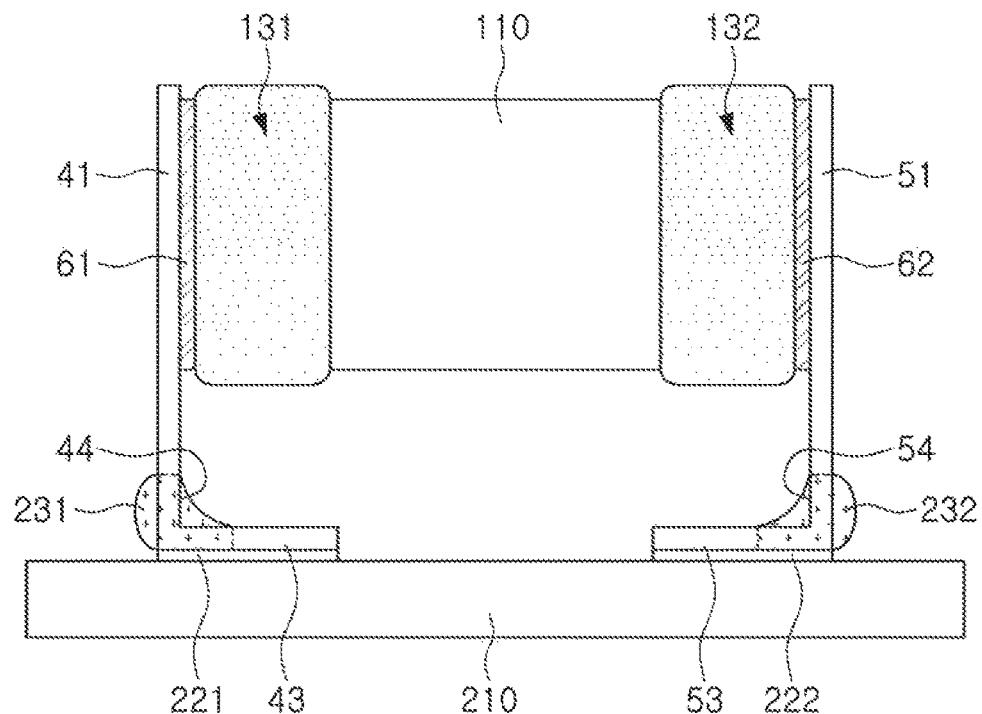
FIG. 11 is a schematic front view illustrating a state in which the multilayer electronic component according to an embodiment in the present disclosure is mounted on a circuit board.

FIG. 11 is a schematic front view illustrating a state in which the multilayer electronic component according to the first embodiment in the present disclosure is mounted on a circuit board.

Referring to FIG. 11, a board having a multilayer electronic component according to the first embodiment includes the circuit board 210 having first and second electrode pads 211 and 222 disposed on one surface thereof and the multilayer electronic component mounted on an upper surface of the circuit board 210 so that the first and second connection terminals 40 and 50 thereof are connected to the first and second electrode pads 221 and 222, respectively.

Here, a case in which the multilayer electronic component is mounted on the circuit board 210 by solders 231 and 232 is illustrated and described, but conductive pastes or adhesives may be used instead of the solders, if necessary.

According to the present embodiment, the first and second cut portions 44 and 54 of the first and second connection terminals 40 and 50 may serve as the solder pockets that may trap the solders 231 and 232 on the first surface of the capacitor body 110.

Therefore, when the multilayer electronic component 10 is mounted on the circuit board 210, the solders 231 and 232 may be effectively trapped in the solder pockets 44 and 54, respectively, and formation of solder fillets on the capacitor body 110 and the first and second external electrodes 131 and 132 may thus be suppressed.

Therefore, a path through which piezoelectric vibrations of the multilayer electronic component are transferred may be blocked, and the solder fillets and a maximum displacement point in the capacitor body 110 may be spaced apart from each other to improve an acoustic noise reducing effect of the multilayer electronic component.

In addition, according to the present embodiment, a vibration amount of the piezoelectric vibrations of the multilayer electronic component transferred to the circuit board at an audio frequency within 20 kHZ of the multilayer electronic component may be effectively suppressed by the acoustic noise reducing structure described above.

Therefore, high frequency vibrations of the multilayer electronic component may be reduced to prevent malfunctions of sensors that may be caused by high frequency vibrations in a high frequency region of 20 kHZ or more of the multilayer electronic component in information technology (IT) or industry/electrical component fields and suppress accumulation of internal fatigue of the sensors due to vibrations for a long period of time.

Figure 12:
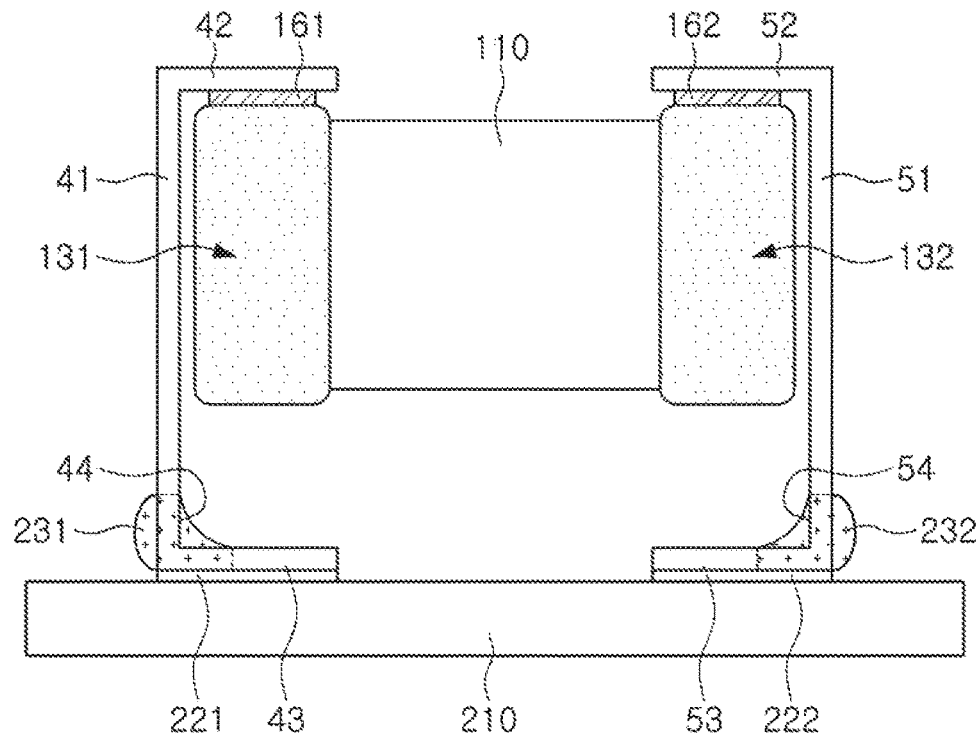
FIG. 12 is a schematic front view illustrating a state in which the multilayer electronic component according to another embodiment in the present disclosure is mounted on a circuit board.

FIG. 12 is a schematic front view illustrating a state in which the multilayer electronic component according to another embodiment in the present disclosure is mounted on a circuit board.

Referring to FIG. 12, vibrations may be transferred from the capacitor body 110 to the connection terminals on an upper surface of the capacitor body 110. That is, the solder fillets and the maximum displacement point in the capacitor body 110 may be spaced apart from each other as much as possible to further improve the acoustic noise reducing effect of the multilayer electronic component as compared to the first exemplary embodiment.

In addition, the vibrations may be reduced in a process in which they are transferred by elasticity of the first and second connection terminals 40 and 50 to further reduce the acoustic noise.

As set forth above, according to embodiments in the present disclosure, acoustic noise in an audio frequency region of 20 kHZ or less and the high frequency vibrations in the high frequency region of 20 kHZ or more of the multilayer electronic component may be reduced.

While exemplary embodiments have been shown and described above, it will be apparent to those skilled in the art that modifications and variations could be made without departing from the scope of the present invention as defined by the appended claims.

What is claimed is:

1. A multilayer electronic component comprising:
a capacitor body comprising a plurality of dielectric layers and a plurality of first and second internal electrodes alternately disposed with respective dielectric layers interposed between each pair of first and second internal electrodes, the capacitor body having first and second surfaces opposing each other, third and fourth surfaces connected to the first and second surfaces and opposing each, other, and fifth and sixth surfaces connected to the first, second third and fourth surfaces, and opposing each other, one end of the first internal electrode being exposed through the third surface, and one end of the second internal electrode being exposed through the fourth surface;
first and second external electrodes disposed on the third and fourth surfaces of the capacitor body, respectively; and
first and second connection terminals connected to the first and second external electrodes, respectively,
wherein the first connection terminal includes a first vertical portion disposed to face the first external electrode, a first horizontal portion extended from a lower end of the first vertical portion in a direction toward the fourth surface of the capacitor body, and a first cut portion formed in a portion connecting the first vertical portion and the first horizontal portion to each other,
the second connection terminal includes a second vertical portion disposed to face the second external electrode, a second horizontal portion extended from a lower end of the second vertical portion in a direction toward the third surface of the capacitor body, and a second cut portion formed in a portion connecting the second vertical portion and the second horizontal portion to each other, and
the first and second vertical portions cover an entirety of the first and second external electrodes, respectively.

2. The multilayer electronic component of claim 1, wherein the first cut portion includes a first stress suppressing portion formed in the lower end of the first vertical portion and a first solder pocket communicating with the first stress suppressing portion and formed in one end of the first horizontal portion, and
the second cut portion includes a second stress suppressing portion formed in the lower end of the second vertical portion and a second solder pocket communicating with the second stress suppressing portion and formed in one end of the second horizontal portion.

3. The multilayer electronic component of claim 1, wherein the first cut portion is formed in at least one edge of the first connection terminal in a direction in which the fifth and sixth surfaces of the capacitor body are connected to each other, and
the second cut portion is formed in at least one edge of the second connection terminal in the direction in which the fifth and sixth surfaces of the capacitor body are connected to each other.

4. The multilayer electronic component of claim 1, further comprising conductive adhesive layers disposed between the first and second external electrodes and the first and second vertical portions, respectively.

5. The multilayer electronic component of claim 1, further comprising a capsule portion covering at least portions of upper portions of the capacitor body, the first and second external electrodes, and the first and second connection terminals in a state in which the first and second cut portions are exposed and including an insulator.

6. The multilayer electronic component of claim 5, wherein the capsule portion covers entirety of the capacitor body and the first and second external electrodes.

7. A board having a multilayer electronic component, comprising:
a circuit board having first and second electrode pads disposed on one surface thereof; and
the multilayer electronic component of claim 1 mounted on the circuit board so that the first and second horizontal portions of the first and second connection terminals are connected to the first and second electrode pads, respectively.

8. The multilayer electronic component comprising:
a capacitor body comprising a plurality of dielectric layers and a plurality of first and second internal electrodes alternately disposed with respective dielectric layers interposed between each pair of first and second internal electrodes, the capacitor body having first and second surfaces opposing each other, third and fourth surfaces connected to the first and second surfaces and opposing each other, and fifth and sixth surfaces connected to the first, second third and fourth surfaces, and opposing each other, one end of the first internal electrode being exposed through the third surface, and one end of the second internal electrode being exposed through the fourth surface;
first and second external electrodes disposed on the third and fourth surfaces of the capacitor body, respectively; and
first and second connection terminal includes a first vertical portion disposed to face the electrodes, respectively,
wherein the first connection terminal includes a first vertical portion disposed to face the first external electrode, a first horizontal portion extended from a lower end of the first vertical portion in a direction toward the fourth surface of the capacitor body, and a first cut portion formed in a portion connecting the first vertical portion and the first horizontal portion to each other, the second connection terminal includes a second vertical portion disposed to face the second external electrode, a second horizontal portion extended from a lower end of the second vertical portion in a direction toward the third surface of the capacitor body, and a second cut portion formed in a portion connecting the second vertical portion and the second horizontal portion to each other, the first cut portion is positioned in a center of the first connection terminal in a direction in which the fifth and sixth surfaces of the capacitor body are connected to each other, and the second cut portion is positioned in a center of the second connection terminal in the direction in which the fifth and sixth surfaces of the capacitor body are connected to each other.

9. A multilayer electronic component comprising:

a capacitor body comprising a plurality of dielectric layers and a plurality of first and second internal electrodes alternately disposed with respective dielectric layers interposed between each pair of first and second internal electrodes, the capacitor body having first and second surfaces opposing each other, third and fourth surfaces connected to the first and second surfaces and opposing each other, and fifth and sixth surfaces connected to the first, second third and fourth surfaces, and opposing each other, one end of the first internal electrode being exposed through the third surface, and one end of the second internal electrode being exposed through the fourth surface;

first and second external electrodes disposed on the third and fourth surfaces of the capacitor body, respectively, and including first and second body portions spaced apart from each other respectively disposed on the third and fourth surfaces of the capacitor body and first and second band portions respectively extended from the first and second body portions to portions of the first surface of the capacitor body; and first and second connection terminals connected to the first and second external electrodes, respectively, wherein the first connection terminal includes a first vertical portion disposed to face the first external electrode, a first horizontal portion extended from a lower end of the first vertical portion in a direction toward the fourth surface of the capacitor body, and a first cut portion formed in a portion connecting the first vertical portion and the first horizontal portion to each other, the second connection terminal includes a second vertical portion disposed to face the second external electrode, a second horizontal portion extended from a lower end of the second vertical portion in a direction toward the third surface of the capacitor body, and a second cut portion formed in a portion connecting the second vertical portion and the second horizontal portion to each other, the first connection terminal further includes a third horizontal portion extended from an upper end of the first vertical portion to be connected to the first band portion, and the second connection terminal further includes a fourth horizontal portion extended from an upper end of the second vertical portion to be connected to the second band portion.

10. The multilayer electronic component of claim 9, wherein the first connection terminal further includes a third cut portion formed in a portion connecting the first vertical portion and the third horizontal portion to each other, and the second connection terminal further includes a fourth cut portion formed in a portion connecting the second vertical portion and the fourth horizontal portion to each other.

11. The multilayer electronic component of claim 10, wherein the third cut portion includes a third stress suppressing portion formed in the upper end of the first vertical portion and a third solder pocket communicating with the third stress suppressing portion and formed in one end of the third horizontal portion, and the fourth cut portion includes a fourth stress suppressing portion formed in the upper end of the second vertical portion and a fourth solder pocket communicating with the fourth stress suppressing portion and formed in one end of the fourth horizontal portion.

12. The multilayer electronic component of claim 10, wherein the third cut portion is positioned in a center of the first connection terminal in a direction in which the fifth and sixth surfaces of the capacitor body are connected to each other, and the fourth cut portion is positioned in a center of the second connection terminal in the direction in which the fifth and sixth surfaces of the capacitor body are connected to each other.

13. The multilayer electronic component of claim 10, wherein the third cut portion is formed in at least one edge of the first connection terminal in a direction in which the fifth and sixth surfaces of the capacitor body are connected to each other, and the fourth cut portion is formed in at least one edge of the second connection terminal in a direction in which the fifth and sixth surfaces of the capacitor body are connected to each other.

14. The multilayer electronic component of claim 10, further comprising conductive adhesive layers disposed between the third and fourth horizontal portions and the first and second band portions, respectively.

15. A multilayer electronic component comprising:

a capacitor body having six surfaces and a substantially rectangular cross-section, the capacitor body having a first external electrode disposed on a first surface and a second external electrode disposed on a second surface opposite the first surface;

a first connection terminal; and a second connection terminal, each of the first connection terminal and the second connection terminal having a vertical portion and a horizontal portion, the horizontal portions configured to connect to a circuit board, wherein the first connection terminal and the second connection terminal each have a cut portion formed at an intersection of the corresponding vertical and horizontal portions, the cut portion extending into the corresponding vertical and horizontal portions, and the first and second vertical portions cover an entirety of the first and second external electrodes, respectively.

16. The multilayer electronic component of claim 15, wherein the vertical portions of the first connection terminal and the second connection terminal are connected to the corresponding external electrodes.

17. The multilayer electronic component of claim 15, wherein
- the first external electrode and the second external electrode are further disposed on a third surface substantially perpendicular to and connecting the first surface and the second surface,
- the first connection terminal and the second connection terminal each further have a second horizontal portion, the second horizontal portion being substantially parallel to the corresponding first horizontal portion, and separated from the corresponding horizontal portion by the corresponding vertical portion, and
- the first external electrode and the second external electrode are connected to the second horizontal portions of the corresponding connection terminals such that the second horizontal portions are disposed above the corresponding external electrodes.

18. The multilayer electronic component of claim 17, wherein the first connection terminal and the second connection terminal each further have a second cut portion formed at an intersection of the corresponding vertical and second horizontal portions, the cut portion extending into the corresponding vertical and second horizontal portions.

\* \* \* \* \*